United States Patent [19]

Blackham

[11] Patent Number: 4,713,782

[45] Date of Patent: Dec. 15, 1987

[54] METHOD AND APPARATUS FOR MEASURING A TRANSFER FUNCTION

[75] Inventor: Ray Blackham, Marysville, Wash.

[73] Assignee: Hewlett-Packard Company, Palo Alto, Calif.

[21] Appl. No.: 644,309

[22] Filed: Aug. 23, 1984

[51] Int. Cl.[4] .......................... G06F 15/20; G06F 7/34
[52] U.S. Cl. ..................................... 364/553; 364/726; 364/733; 371/24; 375/18
[58] Field of Search ............... 364/553, 724, 725, 825, 364/827, 733, 829, 726; 375/13, 14, 18; 371/24

[56] References Cited

U.S. PATENT DOCUMENTS

| | | | |
|---|---|---|---|
| 3,586,846 | 6/1971 | Ley | 364/553 |
| 3,643,073 | 2/1972 | Sawamura | 364/553 |
| 3,973,112 | 8/1976 | Sloane | 364/553 |
| 4,122,529 | 10/1978 | Hoech | 364/553 X |
| 4,328,552 | 5/1982 | Stovall | 364/553 X |
| 4,352,160 | 9/1982 | Frech | 364/553 |
| 4,354,177 | 10/1982 | Sloane | 364/553 X |
| 4,375,692 | 3/1983 | Shensa et al. | 364/553 X |
| 4,397,029 | 8/1983 | Satorius et al. | 364/553 X |

*Primary Examiner*—Parshotam S. Lall
*Assistant Examiner*—Kevin J. Teska
*Attorney, Agent, or Firm*—Douglas A. Kundrat

[57] ABSTRACT

A transfer function analyzer measures the real and imaginary parts of the Fourier transform of a stimulus signal applied to a device and of a resulting response signal. The integration which is performed as part of the Fourier transformation is performed as a summation of a central sector of discrete data points within the period of integration plus the products of the coefficients of weighting polynomials multiplied by preceding and succeeding sectors of data points beyond the central sector. An accurate integration is obtained whether or not the period of integration begins or ends upon discrete data points.

10 Claims, 8 Drawing Figures

METHOD AND APPARATUS FOR MEASURING A TRANSFER FUNCTION

BACKGROUND AND SUMMARY OF THE INVENTION

The transfer function of an electrical or mechanical device may be analyzed by applying a stimulus to the device, measuring the device response and then comparing the response to the stimulus. The real and imaginary portions of the Fourier transforms of the response and stimulus signals may be determined by multiplying the signals by a complex exponential and then integrating the signals over an integral number of cycles of the frequency of interest.

Apparatus which have been constructed according to the prior art have utilized analog techniques to measure the device transfer functions. Exemplary of such prior art apparatus is the Bafco Co., Inc., Model No. 916 Universal Two Channel Sweep Frequency Response Analyzer which applies an analog stimulus signal to a device and then integrates the analog stimulus and response signals as part of the measurement of the transfer function. Such prior art apparatus require the use of analog computational methods which tend to be less accurate than comparable digital methods.

In accordance with the illustrated preferred embodiment of the present invention, a transfer function analyzer accurately and efficiently performs transfer function analyses using digital techniques. The analyzer applies a stimulus signal to a device, samples the stimulus signal and the resulting response signal, multiplies both signals by a discrete complex exponential and integrates the multiplied signals to yield the Fourier transforms of the stimulus and response signals. The transfer function may then be found by dividing the Fourier transform of the response signal by the Fourier transform of the stimulus signal. Measurement of the integral of each multiplied signal is performed by summing a central sector of data points and by adding to this sum both a preceding sector multiplied by a data independent preceding weighting function and a succeeding sector multiplied by a data independent succeeding weighting function.

The analyzer is capable of determining the transfer function of a device at any stimulus signal frequency within a given range. Accuracy is independent of the period of the stimulus signal and of the relationship between the stimulus signal frequency and the sample rate. Thus, it is not necessary for the period of integration to begin or end at a discrete data point. If, for example, the period ends between two adjacent discrete data points, then the analyzer uses a modified succeeding weighting polynomial to measure the integral between the two adjacent discrete data points. Thus, measurement accuracy does not change with changes in the frequency of the stimulus signal.

DETAILED DESCRIPTION OF THE PREFERRED EMBODIMENT

Figure 1:
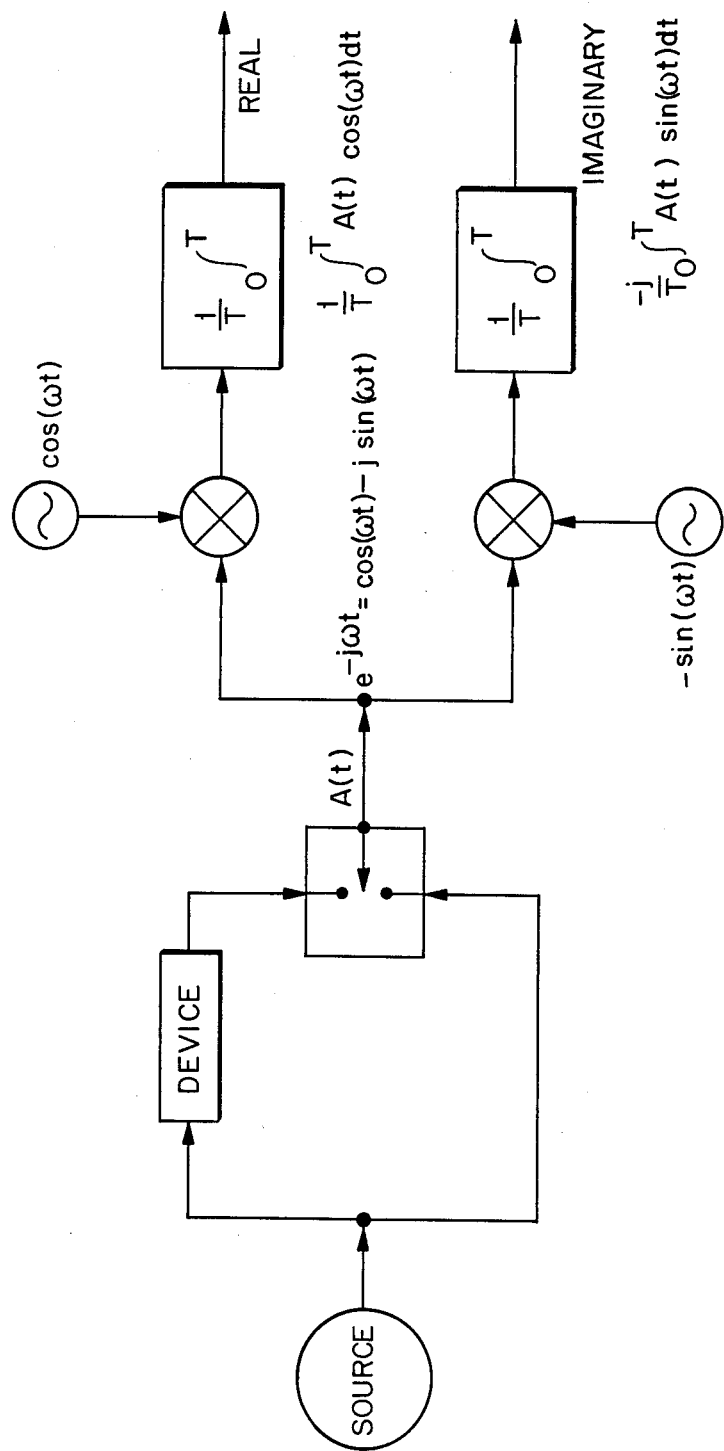
FIG. 1 is a block diagram of a prior art transfer function analyzer which uses continuous signals and analog techniques.

FIG. 1 is a block diagram of a prior art transfer function analyzer which uses continuous signals and analog techniques. A stimulus signal and a response signal are both multiplied by the complex exponential $e^{-j\omega t}$ which is equivalent to multiplication by the two functions $\cos(\omega t)$ and $-j\sin(\omega t)$ in accordance with the trigonometric identity. Integration of the resultant signals over an integral number of cycles of the frequency of interest yields an estimate of the real and imaginary parts of the Fourier transform of the stimulus and response signals and rejects higher order harmonic contributions. Subsequent processing may be performed to measure the transfer function of the device. Since only continuous signals are used, minor changes in the duration of the period of integration have little or no effect upon the accuracy of the measurement.

Figure 2:
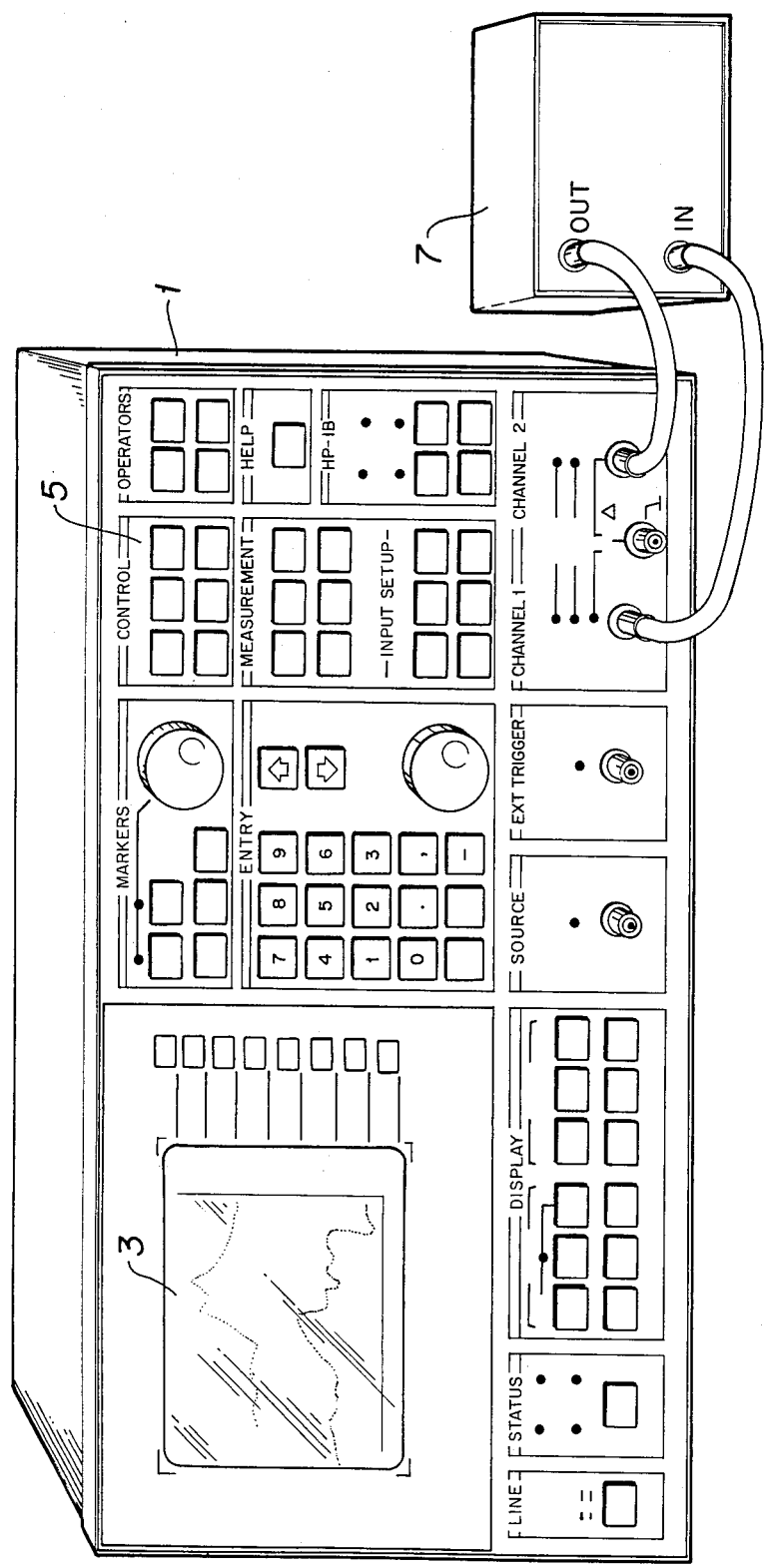
FIG. 2 shows a transfer function analyzer which is constructed in accordance with the preferred embodiment of the present invention.

FIG. 2 shows a transfer function analyzer 1 which is constructed in accordance with the preferred embodiment of the present invention. Analyzer 1 may be used to drive an electrical or mechanical device 7 with a stimulus signal such as a sinusoid or a linearly or logarithmically swept sinusoid. Analyzer 1 may also be used to record a device 7 response signal which is excited by the stimulus signal. Various parameters and commands may be input to analyzer 1 through front panel 5 and the results of the transfer function measurement may be displayed on CRT 3.

Figure 3:
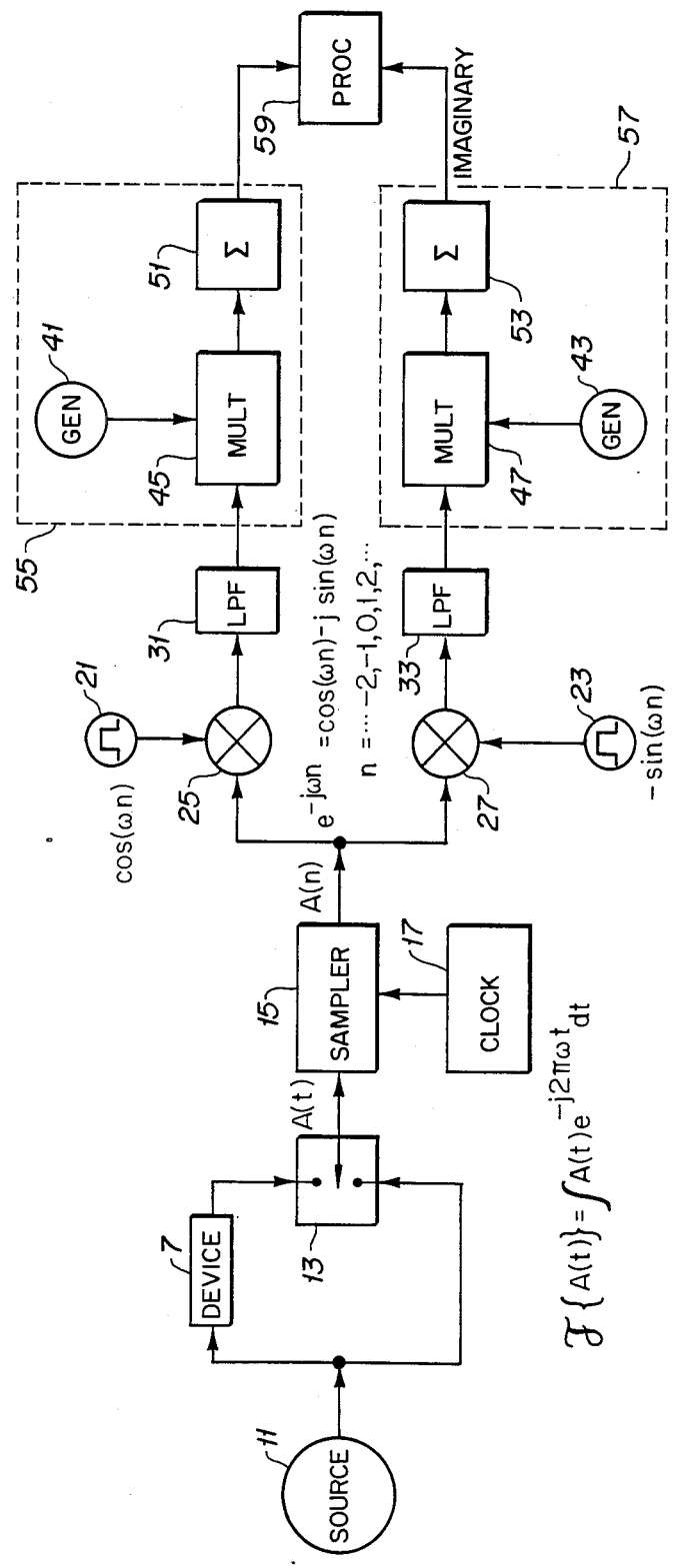
FIG. 3 is a block diagram of the analyzer shown in FIG. 2.

FIG. 3 is a block diagram of analyzer 1. Source 11 provides a stimulus signal such as a sine wave or a linearly or logarithmically stepped sinusoid to device 7 to excite a response signal. Each of the signals may be processed by separate channels, or both may be applied to a switch 13 as shown in FIG. 3, which may be used to select either signal for further processing by a single channel. For the sake of clarity, the selected continuous signal will be referred to as $A(t)$ since both signals are processed in an identical fashion. A clock 17, operating at a clock frequency $f_c$, causes a sampler 15 to sample $A(t)$ once per clock cycle. The output of sampler 15 is the discrete signal $A(n)$.

Sources 21 and 23 and mixers 25 and 27 multiply $A(n)$ by a discrete complex exponential $e^{-j\omega n}$ which may be rewritten as $\cos(\omega n) - j\sin(\omega n)$. The normalized radian frequency, $\omega$, is defined as $f_s/f_c$ with $f_s$ being the particular stimulus frequency of interest at which the transfer function is to be analyzed. Low pass filters 31 and 33 may be used to reject components of the multiplied signals which are above the stimulus signal frequency so that some harmonics due to non-linearities may be eliminated.

Integrators 55 and 57 integrate the multiplied signals and yield an estimate of the Fourier transforms of the stimulus and response signals. Processor 59 may be used to divide the Fourier transform of the stimulus signal by the Fourier transform of the response signal to give the transfer function of the device 7. The period of integration consists of an integer number of cycles of the stimulus signal frequency. For the sake of clarity, the output of low pass filter 31 will be referred to as S(n) and the operation of only integrater 55 will be discussed since integrator 57 operates in an identical fashion. Function generators 41 and 43 may be used to generate the preceding and succeeding weighting polynomials. Multiplier 45 multiplies the preceding sector of data points by the coefficients of the preceding weighting polynomial and multiplies the succeeding sector of data points by the coefficients of the succeeding weighting polynomial. Summer 51 sums the central sector of data points with the product of the preceding data points and the preceding weighting polynomial coefficients plus the product of the succeeding data points and the succeeding weighting polynomial coefficients.

If the assumption (necessary for the definition of a transfer function) is made that device 7 is linear, then $f_c$ theoretically could be as low as the Nyquist rate of two times the stimulus signal frequency, $f_s$. In reality, the sample rate affects the accuracy with which the transfer function may be measured since the number of data points that may be used to measure an individual integral increases as $f_c$ increases. For a fifth order fit (N=5), it was found that a dynamic range of 80 dB could be obtained with an $f_c$ of approximately ten times the stimulus signal frequency.

Figure 4:
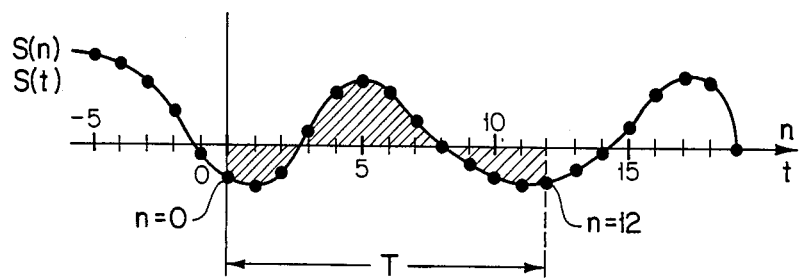
FIG. 4 shows a signal which is to be integrated over a period which begins and ends exactly upon discrete data points.

FIG. 4 shows the case in which the integration period, T, of the signal S(t) begins exactly upon a discrete data point (n=0) and ends exactly upon a discrete data point (n=12). In this case, measurement of the integral using only a first order fit would merely require a summation of the n=0 through the n=12 data points:

$$\frac{1}{N} \sum_{n=0}^{N} A(n)e^{-j\omega n} = \frac{1}{N} \sum_{n=0}^{N} S(n). \tag{1}$$

Or, as shown in FIG. 3, the integral may be viewed as:

$$\frac{1}{N} \sum_{n=0}^{N} A(n)e^{-j\omega n} = \tag{2}$$

$$\frac{1}{N} \sum_{n=0}^{N} A(n)\cos(\omega n) - j\left(\frac{1}{N}\right) \sum_{n=0}^{N} A(n)\sin(\omega n).$$

Figure 5A:
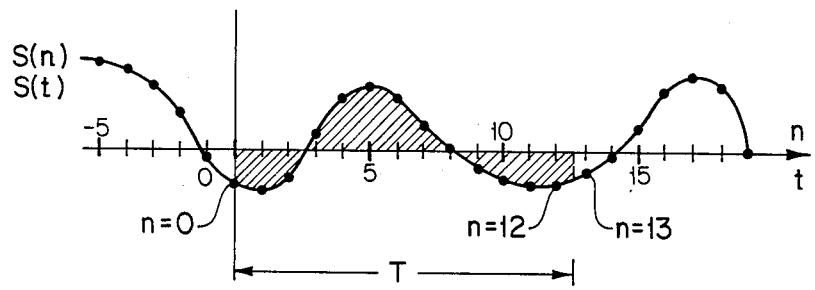
FIGS. 5A-B show a signal which is to be integrated over a period which ends between two adjacent discrete data points.
Figure 5B:
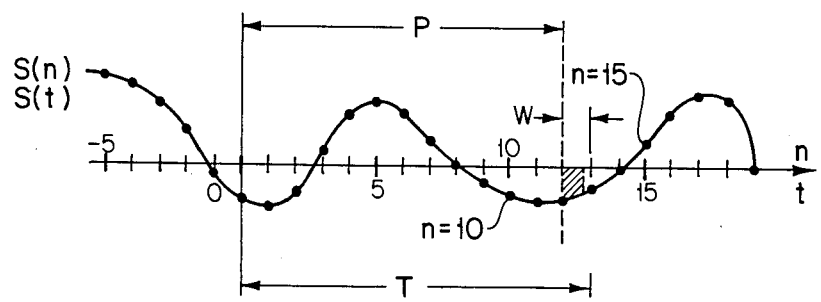

The more usual case occurs when the integration period, T, is not an integer multiple of n. In this case, shown in FIG. 5A, the period T begins at a discrete data point but ends between two adjacent discrete data points. Direct summation would, of course, yield an erroneous integration and some method must be utilized by which the area under S(t) between n=12 and n=13 may be incorporated into the overall integral of S(t) over the period, T. In FIG. 5B, the partial portion of integration between n=12 and n=13 is defined to be W in width. With the units of n normalized such that d=1 and with d being defined as the distance between n and n+1, W is between 0 and 1. P is defined as the integer number of discrete data points in the period, T, exclusive of the starting point at n=0. N, the order of the weighting polynomials, defines the order of the polynomial fit to the measured data. Of course, a minimum of N+1 data points must be measured for a fit of order N. M is the number of data points on either side of each individual integration segment (e.g., between n=5 and n=6) which are used to create the N-th order fit to that segment. For equal numbers on each side and for N of odd order, M=(N−1)/(2).

The analyzer shown in FIG. 2 measures the integral over the entire period, T, by computing a sum of (i) a central sector of data points, plus (ii) a preceding sector of data points times the coefficients, $C_i$, of a preceding weighting polynomial, plus (iii) a succeeding sector of data points times the coefficients, $E_i$, of a succeeding weighting polynomial. The preceding weighting polynomial is only dependent upon the desired order of fit and may be derived as soon as N and M are known. The succeeding weighting polynomial is dependent upon the order of fit and is also dependent upon the partial width, W. Since T may be set to begin at n=0, W is defined by the frequency, $f_s$, and may be derived as soon as $f_s$ is known. Persons of ordinary skill in the art will be able to derive coefficients in the cases wherein N is even, or where unequal numbers of data points on either side of the integration segments are used, or T does not begin at n=0.

The analyzer shown in FIG. 2 may be viewed, very roughly, as measuring the integral over the entire period, T, by iteratively measuring the individual integration segments between adjacent discrete data points and by then summing the individual integrals. The final partial integral segment occupying only the partial portion, W, of the distance between two adjacent discrete data points (between n=12 and n=13 in FIG. 5A) is added to the summation. The coefficients of an N-th order preceding weighting polynomial are multiplied by N+1 discrete data points of S(n) which are adjacent to the individual integral being measured. For example, in FIG. 5A, the integral of S(t) between n=0 and n=1 is measured with N=5 by multiplying the N+1 preceding weighting polynomial coefficients by the data points S(n=−2) through S(n=3) and by then summing the results. The contribution to the integral of the partial portion, W, is discussed below.

The coefficients, $C_i$, of the preceding N-th order weighting polynomial are derived from:

$$\int_x^{x+d} y(\tau)d\tau = \sum_{i=0}^{N} B_i y(x + i + M), \tag{3}$$

$B_i$ are the coefficients of an intermediate N-th order weighting polynomial and:

$$\frac{d^{q+1}}{q+1} = \sum_{i=0}^{N} B_i(i + M)^q, \text{ for } q = 0, 1, 2, \ldots, N. \tag{4}$$

Equation 4 provides N simultaneous equations with N unknowns for the solution of the $B_i$ coefficients. In equation 3, y is the unique fitted N-th order polynomial passing through all N+1 of the data points.

The total period of integration, T, may be broken into two parts such that T=P+W. W is the width of the last partial portion of S(t) (between n=12 and n=13 in FIG. 5A) and, therefore, lies between 0 and 1 in the normalized case. Using equation 3, the integral over the period P is:

$$\int_0^P S(n)dn = \sum_{j=0}^{P-1} \int_j^{j+1} y(\tau)d\tau = \tag{5}$$

-continued $$\sum_{j=0}^{P-1} \sum_{i=0}^{N} B_i S(j + i + M),$$

where $y_j$ is the fitted polynomial over the j-th segment of S(t) within period T. This may be rewritten as:

$$\int_0^P S(n)dn = B_0 S(M) + B_1 S(M + 1) + \ldots + B_N S(N + M) \quad (6)$$
$$+ B_0 S(M + 1) + \ldots + B_{N-1} S(N + M) + B_N S(N + M + 1)$$
$$+ \ldots + B_{N-2} S(N + M) + B_{N-1} S(N + M + 1) + B_N S(N + M + 2)$$
$$+ \vdots \quad + \vdots \quad + \vdots \quad + \ldots$$

After changing the order of summation, equation 6 may be rewritten as:

$$\int_0^P S(n)dn = B_0 S(M) + (B_0 + B_1)S(M + 1) + \ldots + \sum_{i=0}^{N} B_i S(M + N) + \sum_{i=0}^{N} B_i S(M + N + 1) + \ldots \quad (7)$$
$$+ \sum_{i=0}^{N} B_i S(M + P - 2) + \sum_{i=0}^{N} B_i S(M + P - 1) + \ldots$$
$$+ (B_{N-1} + B_N)S(M + P + N - 2) + B_N S(M + P + N - 1).$$

In order to simplify the equations, preceding weighting polynomial coefficients, $C_i$, may be defined as:

$$C_z = \sum_{i=0}^{z} B_i, \text{ for } 0 \leq z \leq N - 1, \quad (8)$$

$$C_z = \sum_{i=0}^{N} B_i, \text{ for } N \leq z \leq P - 1,$$

$$C_z = \sum_{i=z-P+1}^{N} B_i, \text{ for } P \leq z \leq P + N - 1.$$

And, since the sum of the $B_i$ coefficients is equal to one, equation 7 may be written in terms of the preceding polynomial coefficients, $C_i$, as:

$$\int_0^P S(n)dn = \quad (9)$$

$$C_0 S(M) + C_1 S(M + 1) + \ldots + C_{N-1} S(M + N - 1)$$
$$+ \sum_{i=N}^{P-1} S(M + i)$$
$$+ C_P S(M + P) + \ldots + C_{P+N-1} S(M + N - 1)$$

Finally, equation 9 may be simplified and rewritten as the three summations:

$$\int_0^P S(n)dn = \sum_{i=0}^{N-1} C_i S(M + i) + \sum_{i=N}^{P-1} S(M + i) + \quad (10)$$
$$\sum_{i=P}^{P+N-1} C_i S(M + i)$$

The middle summation of equation 10 corresponds to the central sector of S(t) within the period, T. In the middle summation, the $B_i$ coefficients sum to 1 which corresponds to the use of an FIR filter having unity gain. The first and third summations correspond to tails outside of the central sector which are weighted and included in the summation to provide N-th order approximations of S(t) at the edges of the period T. If the period of integration, T, begins and ends at discrete data points, and if M/2 points on each side of the segment are used, then the coefficients of the first and third summations are identical and reversed in order.

In order to complete the integration across the entire period of integration, T, the contribution of the partial portion, W, between two adjacent discrete data points must also be included. Thus, in FIG. 5B, the contribution of S(t) lying between n=12 and n=13 must be included. New coefficients, $D_i$, of a partial portion N-th order weighting polynomial must be used since the width of the partial integration segment to be measured is W instead of width d=1 which was used for the preceding N-th order weighting polynomial. The coefficients, $D_i$, may be derived as:

$$\int_x^{x+W} y(\tau)d\tau = \sum_{i=0}^{N} D_i y(x + i + M), \quad (11)$$

where:

$$\frac{W^{q+1}}{q + 1} = \sum_{i=0}^{N} D_i(i + M)^q, 0 \leq q \leq N. \quad (12)$$

And, since the region, W, lies between the P-th and the (P+1)-th adjacent discrete data points, $$\int_P^{P+W} y_P(\tau)d\tau = \sum_{i=0}^{N} D_i S(P + i + M). \quad (13)$$

Thus, the total integral of S(t) from 0 to T is given by the four summations:

$$\int_0^T S(n)dn = \sum_{i=0}^{N-1} C_i S(M + i) + \sum_{i=N}^{P-1} S(M + i) + \quad (14)$$
$$\sum_{i=P}^{P+N-1} C_i S(M + i) + \sum_{i=0}^{N} D_i S(P + i + M)$$

Therefore, in reality, it is more accurate to characterize the integration as separate summations of data sectors rather than as an iterative multiply and sum operation.

It should also be noted that in matrix notation, $$\vec{W} = \vec{D}[M] \text{ and } \vec{D} = \vec{W}[M]^{-1}. \quad (15)$$

In equation 15, $$\vec{W} = [W, W^2/2, W^3/3, \ldots] \quad (16)$$

$$\vec{D} = [D_0, D_1, D_2, \ldots] \quad (17)$$

$$[M] = \begin{bmatrix} 1 & M & M^2 & \cdots \\ 1 & (M+1) & (M+1)^2 & \cdots \\ \vdots & \vdots & \vdots & \end{bmatrix} \quad (18)$$

Since $[M]^{-1}$ is independent of W and may be calculated in advance, D may be determined from a simple multiplication of a vector by a matrix. Therefore, measurements may be made very quickly since only a minimal number of computations need be repeated for each individual measurement.

The final two summations in equation 14 may be combined by defining coefficients, $E_i$, of a succeeding N-th order weighting polynomial as:

$$E_z = C_{z+p-1} + D_{z-1}, \text{ for } 1 \leq z \leq N,$$
$$E_z = D_N, \text{ for } z = N+1. \quad (19)$$

Using the succeeding polynomial coefficients, $E_i$, equation 14 may be simplified and rewritten so that the entire integral over the period T is:

$$\int_0^T S(n)dn = \sum_{i=0}^{N-1} C_i S(M+i) + \sum_{i=N}^{P-1} S(M+i) + \sum_{i=1}^{N+1} E_i S(M+P-1+i). \quad (20)$$

It should be noted that the period of integration need not necessarily begin at a discrete data point. If the period begins between two adjacent discrete data points and also ends between two adjacent discrete data points, then the total integral may be measured by defining another partial portion at the beginning of the period of integration. A new weighting polynomial having the same form as the succeeding weighting polynomial may then be defined.

Figure 6A:
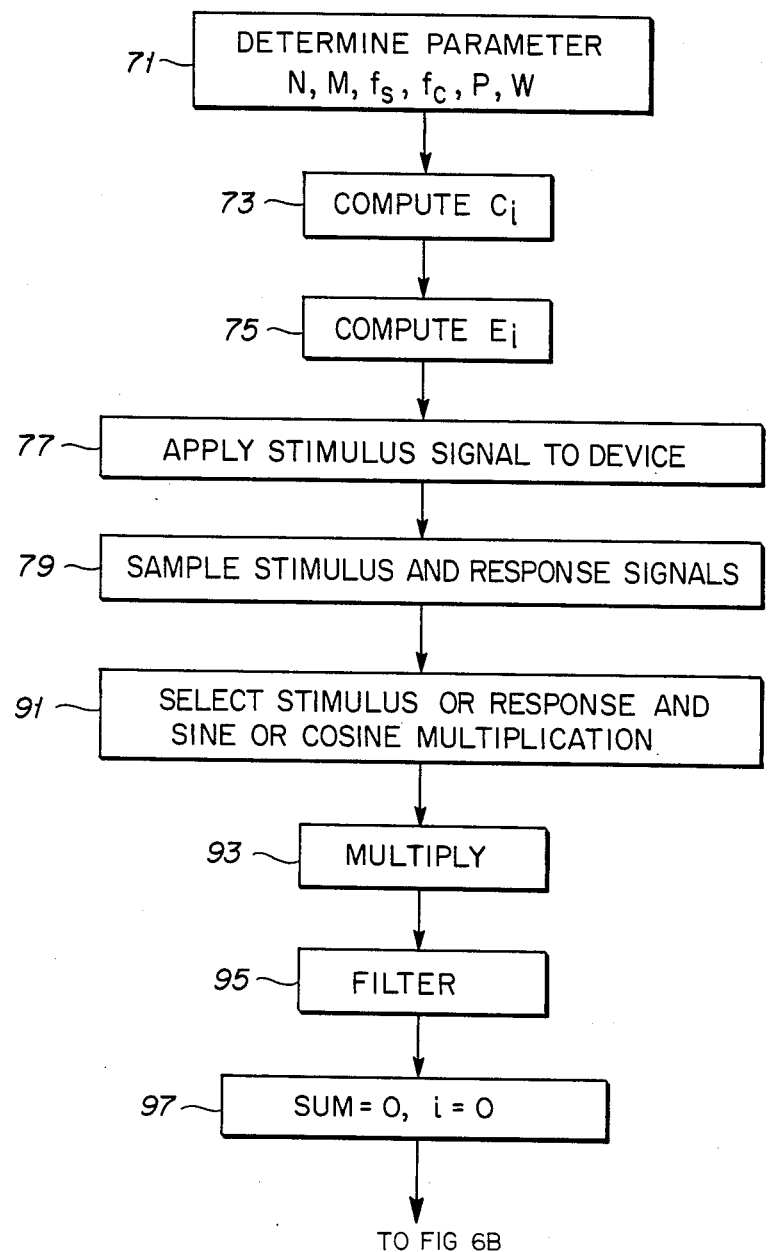
FIGS. 6A-B are a flow chart of the operations performed by the analyzer shown in FIG. 2.
Figure 6B:
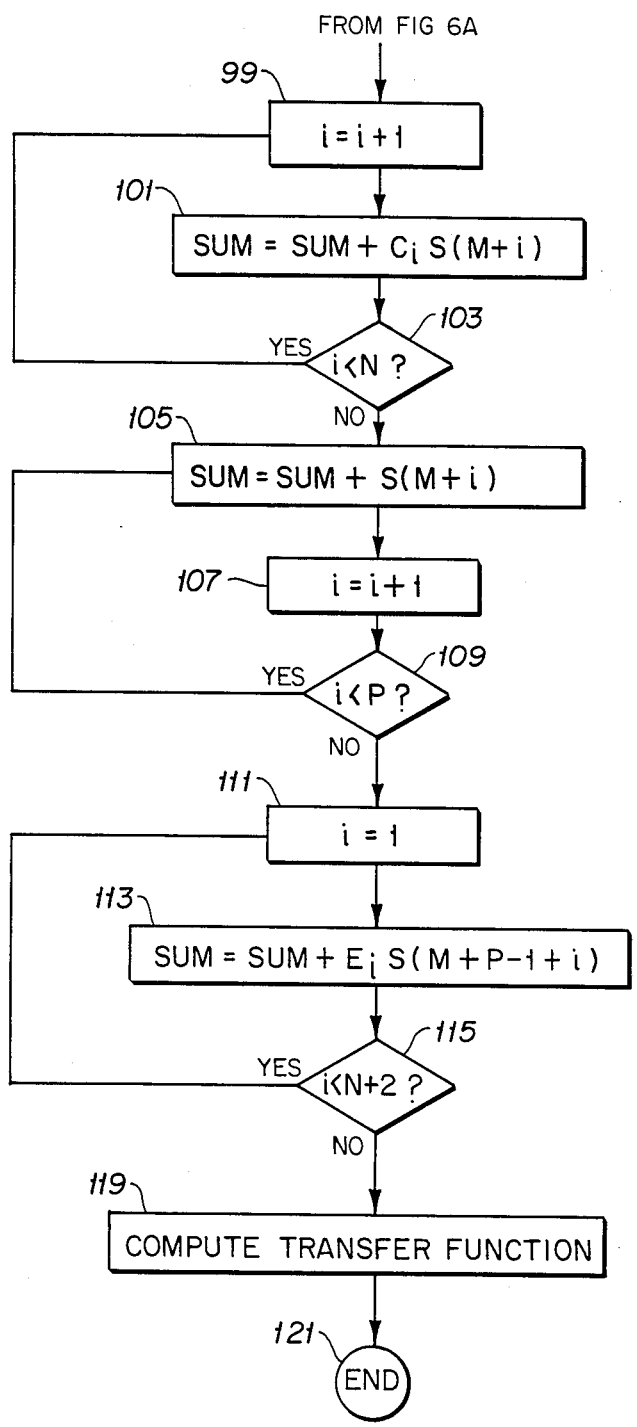

FIG. 6 is a flow chart of the steps performed by the analyzer 1 shows in FIG. 2 during the measurement of the transfer function of device 7. In steps 71–75, the user determines the parameters of the transfer function and the polynomial coefficients $C_i$ and $E_i$ are computed. The coefficients, $C_i$, may be determined with reference to equations 4 and 8 above and the coefficients, $E_i$, may be determined with reference to equations 4, 8, 12 and 19 above. Since the $C_i$ coefficients are measurement independent, they may be determined once and may then be stored in a look up table for future reference. Excitation and sampling is performed in steps 77 and 79. In step 91, a decision is made whether to measure the Fourier transform of the stimulus or of the response signal. Steps 93–117 are the same for both signals. Determination of the real or imaginary part of the selected signal is also decided in step 91 as the consequence of multiplication by either the sine or the cosine function.

In steps 93–95, multiplication by the sine or cosine is performed and the multiplied signal is filtered. Steps 97–117 constitute the integration of the filtered multiplied signal, S(n). In steps 97–103, the sum of the preceding sector data points times the coefficients of the preceding weighting polynomial $C_i$ are added to the total sum. In steps 105–109, the central sector data points are added to the total sum. In steps 111–117, the succeeding sector data points times the coefficients of the succeeding weighting polynomial $E_i$ are added to the total sum. The order in which the three portions of the summations are added is immaterial. At this point, the total sum is the integral of the multiplied and filtered signal. The summation is performed in accordance with equation 20 above. Thus, the total sum is the real or imaginary part of the Fourier transform of the stimulus or response signal. Finally, the transfer function may be obtained by dividing the Fourier transform of the time domain response signal by the Fourier transform of the time domain stimulus signal or by any other well known method such as by tri-spectral averaging.

I claim:

1. A method for integrating a response signal over an integration period, comprising the steps of:
   generating a stimulus signal at a stimulus frequency;
   applying the stimulus signal to a device;
   acquiring the response signal from the device;
   sampling the response signal at a clock rate and thereby generating a plurality of response signal samples;
   separating the signal samples into preceding, central and succeeding sectors;
   generating a preceding weighting polynomial and coefficients thereof;
   generating a succeeding weighting polynomial and coefficients thereof;
   multiplying the preceding sector of response signal samples by the coefficients of the preceding weighting polynomial;
   multiplying the succeeding sector of response signal samples by the coefficients of the succeeding weighting polynomial; and
   summing the central sector of response signal samples, the multiplied preceding sector of response signal samples and the multiplied sector of succeeding response signal samples.

2. A method as in claim 1, wherein the step of separating the response signal samples comprises:
   determining the integration period, T, as an integral number of cycles of the stimulus frequency;
   determining a number of response signal samples, P, within the integration period;
   selecting a desired order of fit, N, for the integration;
   determining a preceding number of response signal samples contained within the preceding sector;
   determining a central number of response signal samples contained within the central sector; and
   determining a succeeding number of response signal samples contained within the succeeding sector.

3. A method as in claim 2, wherein:
   the preceding number is equal to N if the period of integration starts upon a response signal sample;
   the preceding number is equal to N+1 if the period of integtation starts between response signal samples;
   the succeding number is equal to N if the period of integation ends upon a response signal sample; and
   the succeeding number is equal to N+1 if the period of integration ends between response signal samples.

4. A method as in claim 3, wherein the central number is equal to P−M.

5. A method as in claim 4, wherein the preceding and succeeding weighting polynomials are of order N.

6. A method for Fourier transforming the response signal comprising the steps of claim 5 and further comprising, before the step of separating, the additional step of multiplying the response signal by $e^{-j\omega t}$.

7. A method, including the steps of claim 6, for determining a transfer function of a device, the method comprising the steps of:
  performing the steps of claim 6;
  performing again the steps of claim 6, wherein the response signal comprises the stimulus signal and wherein the step of acquiring the response signal comprises acquiring the stimulus signal; and
  computing the transfer function from the acquired stimulus and response signals.

8. An apparatus for integrating a signal over an integration period, comprising:
  acquisition means for acquiring the signal;
  sampling means, coupled to the acquisition means, for sampling the signal and thereby generating a plurality of signal samples;
  separating means, coupled to the sampling means, for separating the signal samples into preceding, central and succeeding sectors;
  preceding generation means for generating the coefficients of a preceding weighting function;
  succeeding generation means for generating the coefficients of a succeeding weighting function;
  preceding multiplier means, coupled to the separating means and to the preceding generation means, for multiplying the signal samples of the preceding sector by the coefficients of the preceding weighting function;
  succeeding multiplier means, coupled to the separating means and to the succeeding generation means, for multiplying the signal samples of the succeeding sector by the coefficients of the succeeding weighting function; and
  summing means, coupled to the preceding and succeeding multiplier means and to the separating means, for summing the multiplied preceding and succeeding signal samples and the central signal samples.

9. An apparatus for Fourier transforming the signal, including the apparatus as in claim 8 and further comprising a multiplier means, coupled between the sampling means and the separating means, for multiplying the signal by $e^{-j\omega t}$.

10. An apparatus for measuring a transfer function of a device, the apparatus comprising the apparatus as in claim 9 and further comprising:
  stimulus means, coupled to the device, for applying a stimulus signal to the device;
  switch means, coupled between the device and the acquisition means, for selecting either the stimulus signal or a response signal generated by the device in response to the stimulus signal; and
  computation means, coupled to the summing means, for computing the transfer function of the device from the stimulus and response signals.

* * * * *